March 1, 1966

H. F. RIETH 3,237,282

PRINTED BOARD WIRING

Filed Jan. 23, 1961

2 Sheets-Sheet 1

INVENTOR:
Harold F. Rieth

By Smyth, Roston & Pavitt
Attorneys.

PRINTED BOARD WIRING

Filed Jan. 23, 1961 2 Sheets-Sheet 2

INVENTOR:
Harold F. Rieth

By Smyth, Roston & Pavitt

Attorneys.

United States Patent Office 3,237,282

Patented Mar. 1, 1966

3,237,282

PRINTED BOARD WIRING

Harold F. Rieth, Pasadena, Calif., assignor to Packard-Bell Electronics Corporation, Los Angeles, Calif., a corporation of California Filed Jan. 23, 1961, Ser. No. 84,100

8 Claims. (Cl. 29—155.5)

This invention relates to methods of producing electronic apparatus on an assembly line basis and, more particularly, to methods of producing electronic apparatus with a relatively small number of workers and at a relatively low cost.

Automation has not yet arrived to any considerable degree in the electronics industry. Generally, electronic apparatus is produced by disposing a plurality of semi-skilled workers along an assembly line and by moving the apparatus to successive workers along the line. Each worker then performs one operation or a few operations such as connecting wires between a pair of designated terminals or a few designated terminals. Electronic apparatus is produced in this manner even though various portions of the electronic industry are quite competitive. For example, the production of radio receivers and television sets is so competitive that a difference of a few cents in the manufacture of each unit may make a difference between considerable profit and loss, especially since large numbers of receivers and television sets are produced by each manufacturer.

Since the electronic industry is quite competitive, considerable thought and effort are constantly being devoted to devise techniques for reducing manufacturing costs. Such thought and effort have been devoted by experts in the field for a considerable number of years and now even decades. In spite of this, however, the assembly techniques used at present correspond, to a large extent, to the assembly techniques used ten or twenty years ago. Any new techniques developed during this time, such as printed circuits, have had certain important disadvantages. For example, printed circuits have been expensive and have had a high rate of rejects, especially since electrical leads cannot be soldered easily to the printed circuits.

This invention provides a method for obtaining the production of electronic apparatus by a considerably reduced number of workers and a considerably reduced cost in comparison to the number of workers and the cost previously required. In the method constituting this invention, an insulating board is first formed having openings or holes or different predetermined shapes. One set of the openings are utilized for fastening means which affix a conductive plate to the bottom of the board. The conductive plate has a predetermined particular shape including webs and strips for establishing electrical connections in the electronic unit manufactured in accordance with the method of this invention.

Some of the webs of the conductive plate are cut after a soldering step. These webs function to unitize the plate and to strengthen it for ready handling before assembly. After the plate is affixed to the bottom of the board, a second set of openings in the board are modified and extended through the plate. These openings have a cone shape and serve to guide the ends of terminal leads during their automatic mounting on the board. The components are then mounted on the board and the terminal ends of the components are dip soldered to the conductive plate. After soldering as indicated above, some of the webs of the conductive plate are simultaneously cut to leave only the desired electrical connections.

Further advantages and features of this invention will become apparent upon consideration of the following description when read in conjunction with the drawing, wherein.

Figures 1, 2, 3, 4, 5, 6, 7:
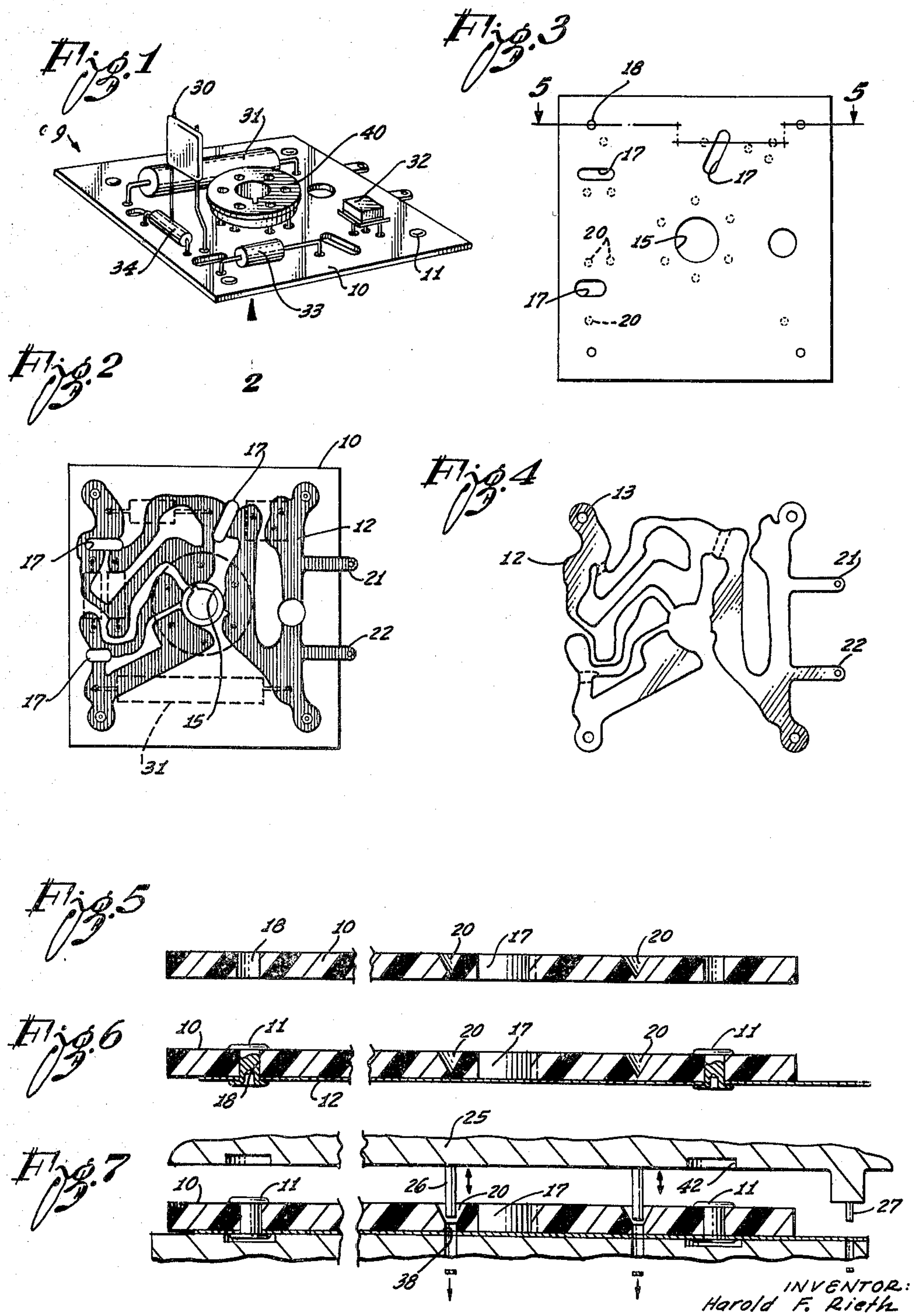
FIGURE 1 is a perspective view of an electronic unit manufactured in accordance with the method of this invention.
FIGURE 2 is a bottom view of the electronic unit manufactured in accordance with the method of this invention.
FIGURE 3 is a top view of the board utilized in the manufacturing method of this invention.
FIGURE 4 is an illustrative conductive sheet utilized in the manufacturing method of this invention.
FIGURE 5 is a sectional view taken along the line 5—5 of FIGURE 3.
FIGURE 6 is a sectional view through the board utilized in the manufacturing method of this invention after the conductive plate has been assembled with the insulating board.
FIGURE 7 illustrates a punching step in the manufacturing method of this invention.

Referring first to FIGURE 1, an electronic unit 9 is shown which may be utilized in electrical apparatus such as a small radio. The unit 9 includes a board 10 which may be made of insulating material such as Bakelite and which serves as a support for a number of other electronic components utilized as part of the electronic unit. The insulating material should have temperature characteristics to withstand the dipping temperature of a dip soldering bath. The board 10 has illustratively a rectangular shape and is perforated with a number of small openings 18 and 20, a number of elongate openings 17 and a relatively large circular opening 15, all depicted in FIGURE 3. The openings 15, 17, 18 and 20 have different functions utilized during the manufacturing process of this invention. The openings or holes 18, for example, are utilized for rivets 11 which attach a sheet or plate 12 made of electrically conductive material. The sheet 12, which is depicted particularly in FIGURE 4 and also in FIGURES 2 and 6, may be a stamping of a material such as steel tin plate.

The conductive sheet 12 has a particular configuration designed for establishing conductive connections between various components utilized in the electronic unit 9. Extending from one side of the sheet or plate 12 are two terminal tabs 21 and 22 to which external connections, not shown, may be made. By means of the rivets 11 mentioned above, the conductive plate 12 is affixed against the bottom of the insulating board 10.

As is hereinafter described, one of the steps in the manufacturing method of the electronic unit 9 is to cut some of the portions or webs of the conductive plate 12. This step is illustrated particularly and hereinafter described in reference to FIGURE 10.

As shown in FIGURE 1, a number of components 30, 31, 32, 33 and 34 are mounted on the insulating board 10 extending through holes 20 in the board. A tube socket 40 is also mounted in the board 20 over the central circular opening 15 in the insulating board 10. As illustrated in FIGURE 5, the small openings 20 are tapered illustratively at a 60 degree angle from the upper surface of the board 10 with the taper being such as to provide for the tip of the cone at the bottom surface of the board 10. In other words, the cone-shaped opening is not truncated. The particular configuration of the opening 20, accordingly, has a relatively large opening at the upper surface, illustratively ⅛-inch in diameter, and then sloped walls down to a point at the lower surface of the insulating board 10. As is hereinafter described, this particular configuration of the openings 20 in the insulating board 10 are to facilitate automatic insertion of various components 30 through 34 for mounting on the board 10.

The first step in the manufacturing process of the invention is to affix the conductive plate 12 against the bottom surface of the board 10. The second step is illustrated in FIGURE 7 and it consists of punching small openings through the center of the cone-shaped openings 20. A short cylindrical portion 38 is in this manner provided at the end of a truncated cone portion of the opening 20. The punch 25, which has a number of depressions 42 for receiving the heads of the rivets 11, inserts the punch members 26 from the larger or base of the cone-shaped openings 20. The punch 25 supports the punch members 26 which are inserted in the openings 20. The punch 25 also has punch members 27 at one end of the punch 25 for perforating the ends of the terminal tabs 21 and 22 extending from the plate 12. At the completion of this step of the manufacturing process, the openings 20 have been modified so as to have the short cylindrical portion 38 at the bottom end thereof. This cylindrical portion 38 includes an opening through the plate 12 which is affixed to the bottom of the board 10 by the rivets 11.

Figure 8:
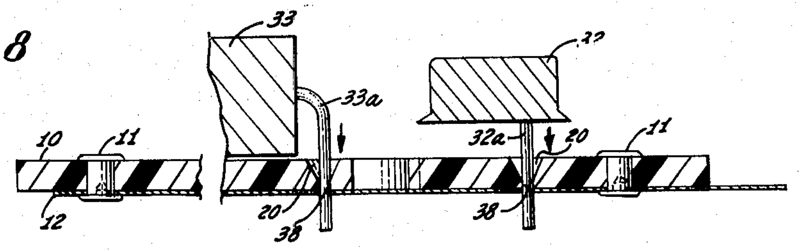
FIGURE 8 illustrates a component mounting step in the manufacturing method of this invention.

The components 31 through 34 are thereupon readily mounted on the board 10, as illustrated in FIGURE 8. The terminal lead 33*a*, for example, of the component 33 fits through one modified opening 20 of the board. The portion 38 of the opening 20 has dimensions such that the terminal lead 33*a* may be forced through it and so that it provides for a snug fit so as to support the component. The board 10, in this manner, snugly grips or holds the terminal lead 33*a* inserted into one of the modified openings 20. Similarly, the component 32, also shown in FIGURE 8, has a terminal lead 32*a* which is pushed into another modified opening 20. The truncated cone portion of the modified openings 20 facilitates centering the flexible terminal leads 33*a*, 32*a*, etc., and compensate for any inaccuracies or misalignments between the equipment which supports the components 31 through 34 and the terminal board 10. If a terminal lead such as the lead 33*a* is slightly misaligned with respect to the cylindrical portion 38 of the modified opening 20, the sloped walls of the truncated cone portion steer the flexible terminal lead to its proper position. The truncated cone portions of the modified openings 20 permit the automatic insertion and mounting of the various components 31 through 34 onto the insulating board 10. Further, due to the snug fit of the cylindrical portion 38 about the terminal leads, the terminal leads make electrical contact with the conductive plate 12 at the bottom of the board 10. The length of the various leads 31*a* through 34*a* is such that they may also extend approximately the same length beneath the conductive plate 12.

Figure 9:
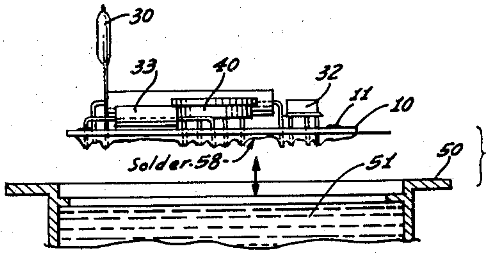
FIGURE 9 illustrates the soldering step in the manufacturing method of this invention.

With the various components 31 through 34 and also the tube socket 40 mounted on the insulator board 10, the board 10 may then be dipped into a solder bath 51 in a tank 50 depicted in FIGURE 9 for soldering the ends of the various terminal leads 31*a* through 34*a* to the plate 12 at the bottom of the board 10. The board 10 need not be immersed into the solder bath 51 but only the ends of the terminal leads are immersed together with the bottom of the plate 12. The tube socket 40 may be inserted into tapered openings substantially similar to the openings 20 described above so that it as well as the components 30 through 34 may be automatically mounted on the board 10.

Figure 10:
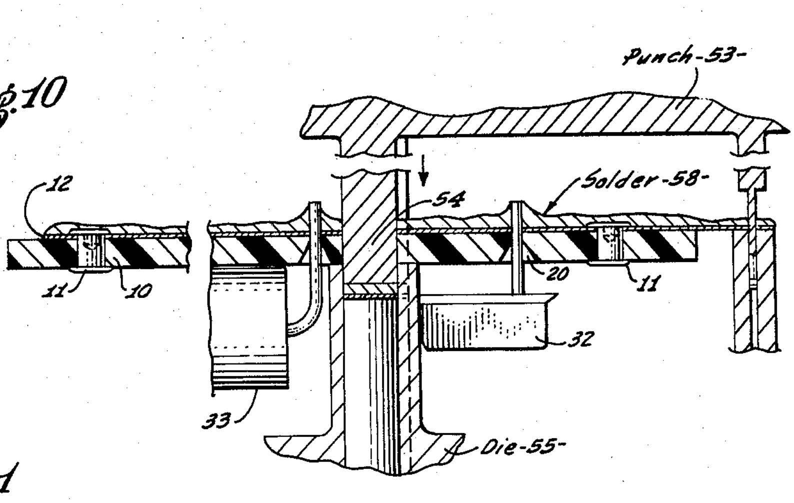
FIGURE 10 illustrates a punching step for removing conductive webs which step is part of the manufacturing method of this invention.

After the soldering operation, some of the electrical paths established by the plate 12 are severed at the position of the elongate openings 17 described above in reference to FIGURE 3. As shown in FIGURE 3, the insulator board 10 has a number of elongate openings 17 and the plate 12 has portions or webs which extend over or adjacent to the openings 17. The plate 12 is fabricated in this manner so as to be one integral unit and to have substantial strength. After the soldering operation, the conductive portions or webs extending over the openings 17 are severed. In FIGURE 10, a punch 53 having a number of punch members 54 is utilized together with a die 55 for cutting the webs of the conductive plate 12 which are adjacent the openings 17. In the particular illustration depicted in FIGURES 1, 2 and 3, etc., three webs are cut or three cuts are made of the conductive plate 12. In FIGURES 2 and 4, the position of these cuttings on the plate 12 are more particularly shown. FIGURE 4 illustrates the cuts in phantom whereas in FIGURE 2, the cuts have been made as depicted by the openings 17 through the bottom of the board 10.

The plate 12, which has now been cut into a number of different fragments, remains tightly affixed to the bottom of the board 10 partially due to the rivets 11 described above and also due to the solder which affixes the portions of the plate 12 to the ends of the terminal leads extending through the board 10 and the openings in the plate 12.

Figure 11:
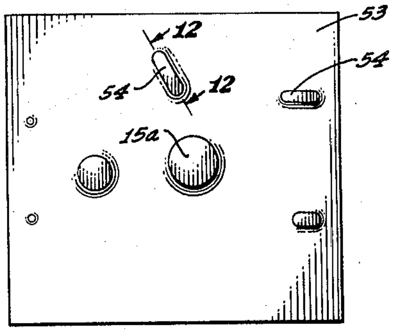
FIGURE 11 is a bottom view of the punch utilized in the step depicted in FIGURE 10.
Figure 12:
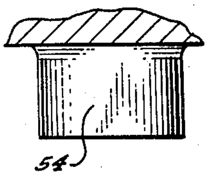
FIGURE 12 is a sectional view taken along lines 12—12 in FIGURE 11.

FIGURES 11 and 12 illustrate the bottom of the punch member 53 and one of the punches 54 respectively which are utilized for cutting or punching holes in the conductive plate 12. The cuttings are made so as to leave only conductive paths which are required for the electronic unit 9. The paths through the conductive plate 12 which have been cut are undesirable for the operation of the electronic apparatus utilizing the unit 9.

The method of manufacturing the electronic unit, as described above, has a number of important advantages. For example, the sheet or plate 12 utilized for the wiring may be made of any conductive metal such as tin plate which is relatively inexpensive. The thickness of the plate 12 may be approximately .006 inch thick and the thickness of the insulator board 10 may be approximately 1/16-inch thick. Both of these components may be relatively inexpensive. Utilizing such components, the usual or conventional silkscreening or photographical operations or etching processes are not required. Operations such as washing and neutralizing are also not required. Further, the scrap due to the cutting operations and the stamping operations forming the particular configuration of the plate 12 may be completely salvaged, reducing the amount of the required tin plate. The wiring provided by the plate 12 is quite strong, stronger than that provided by conventional printed boards where surface soldering is required. Moreover, a major advantage of the present method is that automatic insertion of parts may readily be accomplished due to the truncated cone portions of the modified openings 20 through the board 10 and plate 12. As indicated above, the component terminal leads are somewhat flexible and need not be in exact alignment with the centers of the holes 20.

Although this invention has been disclosed and illustrated with reference to particular application, the principles involved are susceptible of numerous other applications which will be apparent to persons skilled in the art. The invention is, therefore, to be limited only as indicated by the scope of the appended claims.

I claim:

1. A method of producing an electronic circuit, including, the steps of: providing a board made of insulating material and having a number of holes, disposing an electrically conductive plate of predetermined configuration on the board, extending rivets through particular ones of the holes in the board and through the conductive plate to define first extension holes in the conductive plate at positions corresponding to the partiuclar holes in the board and to affix the conductive plate to the board, producing second extension holes in the plate at positions corresponding to second particular holes in the board, inserting a different terminal lead through each of the second particular holes in the board and through each of the second extension holes in the plate, dip soldering the ends of the terminal leads to the plate, and removing particular portions of the conductive plate at positions corresponding to third particular holes in the board to define the electronic circuit.

2. A method of producing an electronic circuit, including the steps of: providing an insulating board with a number of holes of particular configuration, disposing an electrically conductive plate of predetermined configuration on the board, extending rivets through particular ones of the holes in the board to attach the conductive plate to the board, extending second particular ones of the holes in the board through the conductive plate to define extensions in the plate at positions corresponding to the second particular holes in the boards, inserting terminal leads through the second particular holes in the board and their extensions in the plate, dip soldering the ends of the terminal leads to the plate, and cutting through particular portions of the plate positioned in contiguous relationship to third particular holes in the board to remove such particular portions and thereby define the electronic circuit.

3. In a method of providing an electrical circuit defined by electrical connections between various elements of electrical apparatus which are adapted to be mounted on a board of insulating material and wherein each element has terminal connection wires, which method includes the steps of: forming first and second perforations and tapered perforations in the board where connections are to be made, disposing a single sheet of conductive material on one side of the board for establishing particular electrical connections between the terminal connection wires after their insertion into the cone-shaped perforations, extending rivets through the first perforations in the board and through the sheet of conductive material to affix the sheet of conductive material to the board, inserting terminal connection wires of a number of elements into the tapered perforations in the board to mount the elements on the board, soldering the inserted terminal connection wires of the elements to the sheet of conductive material, and removing particular portions of the sheet of conductive material at positions adjacent to the second perforations in the board to define the electrical circuit.

4. In a method in accordance with claim 3, including in addition, the step of punching a hole through the center of each of the tapered perforations in the board to extend the perforations through the conductive sheet, which punching step is provided before the elements are mounted on the board.

5. In a method in accordance with claim 3, including in addition the step of punching a hole having a diameter substantially equal to the diameter of the terminal connecting wire of an element through the center of each of the tapered perforations in the board to extend the perforations through the conductive sheet, which punching step is provided before the elements are mounted on the board, and wherein the sheet of conductive material is made by stamping a plate of tin plate.

6. A method of producing an electronic circuit, including the steps of: stamping a conductive plate to a particular configuration by including webs of material and including removable connective portions, disposing the stamped plate on an insulating board defining a number of openings, with first particular ones of the openings in the board being disposed in contiguous relationship to the removable connective portions of the conductive plate, extending rivets through second particular ones of the openings in the board and through the conductive plate to affix the conductive plate to the board, extending third particular ones of the openings through the board to pass through the plate and to define extended openings in the plate, inserting terminal leads of at least one electrical component through the third openings in the board and through the extended openings in the plate, dip soldering the terminal leads to the conducitve plate, and removing the connective portions of the web at the positions adjacent to the first particular holes in the board to define the electronic circuit.

7. A method of producing an electronic circuit, including the steps of: forming a number of first, second and third particular holes of particular configuration in a board made of insulating material, the first particular ones of the holes being of elongate shape and the second particular ones of the holes being of tapered shape, disposing an electrically conductive plate of predetermined configuration on the board, extending rivets through the third particular holes to affix the conductive plate to the board of insulating material, extending the second particular holes in the board through the plate to form extended holes in the plate at positions corresponding to the second particular holes in the board, inserting terminal leads through the extended holes in the plate to pass through the board and the plate, dip soldering the ends of the terminal leads to the plate, and removing the portions of the plate adjacent to the first particular holes in the board to define the electronic circuit.

8. The method set forth in claim 6 in which the conductive plate is made from tin and in which the ends of all of the terminal leads are dip soldered at the same time.

References Cited by the Examiner

UNITED STATES PATENTS

| | | | |
|---|---|---|---|
| 1,781,537 | 11/1930 | Caruso | 29—155.5 |
| 1,794,831 | 3/1931 | Caruso | 29—155.5 |
| 2,399,753 | 5/1946 | McLarn | 29—155.5 |
| 2,433,384 | 12/1947 | McLarn | 29—155.5 |
| 2,613,252 | 10/1952 | Heibel | 29—155.5 |
| 2,651,833 | 9/1953 | Kernahan | 29—155.5 |
| 2,694,249 | 11/1954 | Kapp | 29—155.5 |
| 2,937,358 | 5/1960 | Bulger | 29—155.5 |
| 2,986,804 | 6/1961 | Greenman | 29—155.5 |
| 3,001,104 | 9/1961 | Brown | 174—68.5 |

FOREIGN PATENTS

| | | |
|---|---|---|
| 344,677 | 3/1931 | Great Britain. |

WHITMORE A. WILTZ, *Primary Examiner.*

JOHN F. CAMPBELL, *Examiner.*